US006208909B1

(12) United States Patent
Kato et al.

(10) Patent No.: US 6,208,909 B1
(45) Date of Patent: Mar. 27, 2001

(54) WAFER TRANSPORT DEVICE

(75) Inventors: Tomoo Kato, Hachioji; Keiji Kimura, Machida, both of (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 09/319,615

(22) PCT Filed: Oct. 13, 1998

(86) PCT No.: PCT/JP98/04617

§ 371 Date: Jun. 8, 1999

§ 102(e) Date: Jun. 8, 1999

(87) PCT Pub. No.: WO99/20552

PCT Pub. Date: Apr. 29, 1999

(30) Foreign Application Priority Data

Oct. 17, 1997 (JP) .................................................. 9-285290

(51) Int. Cl.⁷ ....................................................... G06F 7/00
(52) U.S. Cl. ..................... 700/218; 414/937; 414/331.14; 414/331.18
(58) Field of Search .................................... 700/213, 214, 700/218; 901/47; 414/937, 331.14, 331.18

(56) References Cited

U.S. PATENT DOCUMENTS

| | | | |
|---|---|---|---|
| 4,803,373 | * 2/1989 | Imamura et al. ..................... 250/561 |
| 4,895,486 | * 1/1990 | Baker et al. ......................... 414/331 |
| 4,900,212 | * 2/1990 | Mikahara ............................. 414/416 |
| 5,239,182 | * 8/1993 | Tateyama et al. ................... 414/937 |
| 5,540,098 | * 7/1996 | Ohsawa ................................. 73/629 |
| 5,642,978 | * 7/1997 | Lahne et al. ........................ 414/331 |
| 5,780,849 | * 7/1998 | Kikuchi ........................... 250/231.13 |
| 5,906,469 | * 5/1999 | Oka et al. ............................. 414/416 |
| 6,060,721 | * 5/2000 | Huang ................................. 414/937 |

FOREIGN PATENT DOCUMENTS

| | | |
|---|---|---|
| 62-45036 | 2/1987 | (JP) . |
| 7-297264 | 11/1995 | (JP) . |
| 2606423 | 2/1997 | (JP) . |

* cited by examiner

Primary Examiner—Christopher P. Ellis
Assistant Examiner—Khoi H. Tran
(74) Attorney, Agent, or Firm—Frishauf, Holtz, Goodman, Langer & Chick, P.C.

(57) ABSTRACT

Of a plurality of wafers (15) circumferential edge portions of which are held by slot grooves (14) of a wafer cassette (13), the positions of a wafer (15) to be transferred and the wafers (15) above and beneath it are detected by a first sensor (16) and a second sensor (17). A calculating unit calculates an amount of bend of each wafer (15) based on the detected information. It is determine, based on the calculation result, whether the transfer arm (18) can be inserted under the wafer (15) to be transferred without contacting with the wafer beneath (15) and whether the wafer (15) to be transferred can be lifted up by the transfer arm (18) without contacting with the wafer above (15).

15 Claims, 8 Drawing Sheets

WAFER TRANSPORT DEVICE

DESCRIPTION

1. Technical Field

The present invention relates to a wafer transfer apparatus for taking out a wafer from a wafer cassette and transfer it to another apparatus, if necessary, in order to inspect it or subject it to a subsequent process.

2. Background Art

Figure 9:
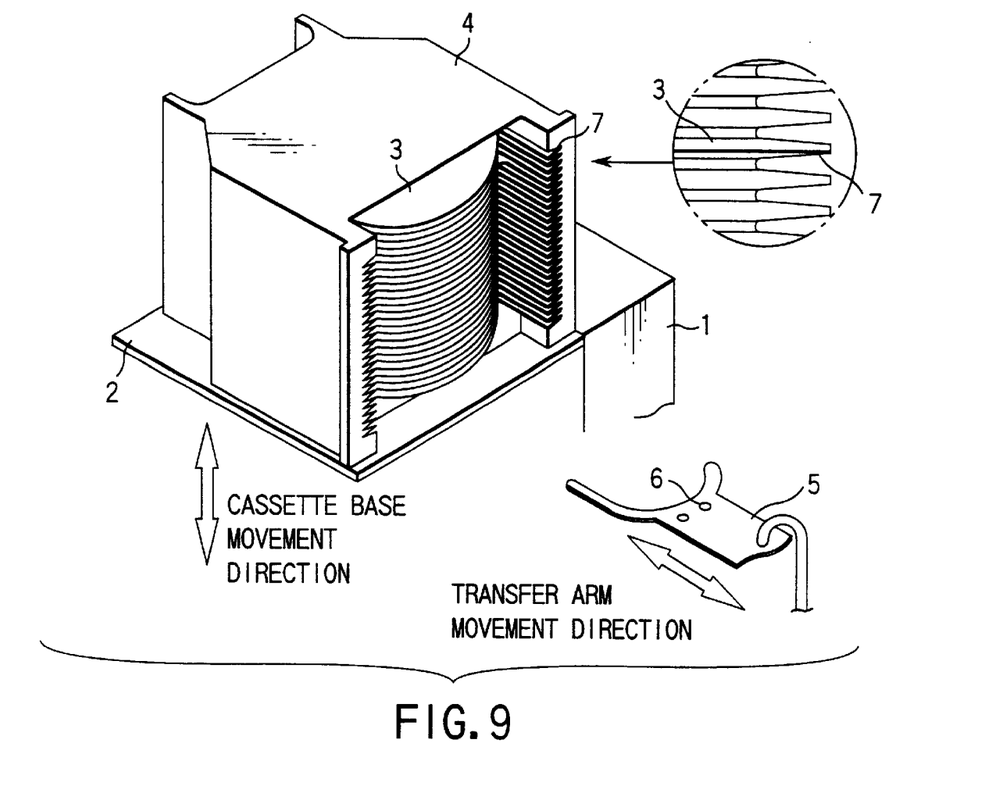
FIG. 9 is a diagram for explaining a conventional wafer transfer apparatus.

FIG. 9 shows an example of conventional wafer transfer apparatuses for taking out a wafer from a wafer cassette by means of a transfer arm. More specifically, a wafer cassette 4 storing a number of wafers 3 one on another is mounted on a cassette base 2 movable up and down by an elevator mechanism portion 1, such that a wafer-inlet/outlet side faces a transfer arm 5 having an attracting portion 6.

An operation of the conventional wafer transfer apparatus will be described in brief. First, the cassette base 2 is moved down by the elevator mechanism portion 1, and the number of detected wafers is counted by a sensor (not shown), thereby detecting a wafer 3 to be transferred. After the sensor detects the wafer 3, the cassette base 2 is moved up by a predetermined amount, and then the transfer arm 5 is moved toward the wafer cassette 4 and inserted under the wafer 3 to be transferred. After the transfer arm 5 is inserted, the cassette base 2 is moved down by a predetermined amount by means of the elevator mechanism portion 1, so that the wafer to be transferred is placed on the transfer arm 5. Then, the wafer 3 to be transferred is attracted by the attracting portion 6, the transfer arm 5 is drawn out of the wafer cassette 4, and the wafer 3 to be transferred is extracted and transferred to a next step, such as an inspecting step.

Figure 8:
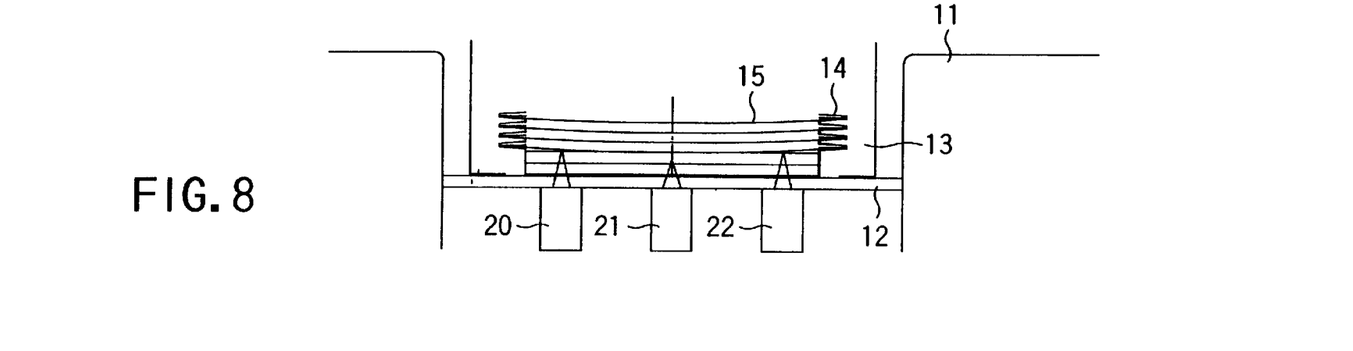
FIG. 8 is a diagram for explaining a fourth embodiment of the present invention.

In the wafer transfer apparatus described above, a plurality of slot grooves 7, for holding the wafers 3 horizontally, are formed in both side walls in the wafer cassette 4 for storing the wafers 3. A view encircled in a right portion of FIG. 8 is an enlarged view showing slot grooves 7 in the right side wall of the wafer cassette 4 viewed from the wafer 3-inlet/outlet side. Thus, the slot grooves 7 hold circumferential edge portions of the wafers 3, so that the wafer can be stored in the wafer cassette 4 keeping the wafers 3 horizontal.

Therefore, if the wafers 3 are stored in the wafer cassette 4 always horizontally at regular intervals, the transfer arm 5 can be smoothly inserted under the wafer 3 to be transferred by the transfer arm 5.

However, when the wafer 3 is first stored in the wafer cassette 4, it is generally inserted by hand, and the wafer 3 may be inserted in the slot grooves at different heights on the left and right. In this case, the inserted wafer 3 is inclined. Due to the inclination of the wafer 3, when the transfer arm 5 is inserted under the wafer 3, the transfer arm 5 may collide with the wafer 3, resulting in a problem that the wafer is damaged.

To solve this problem, for example, as disclosed in Published Japanese Patent No. 2606423, it is proposed that an inserted condition of each wafer 3 to be transferred is detected by a sensor, and if the wafer 3 is inclined, the insertion of the transfer arm 5 is stopped, thereby preventing collision. More specifically, a sensor for detecting a wafer 3 is provided, and a cassette base is moved down relative to the sensor by an elevator mechanism portion, so that the sensor detects each wafer 3 to be transferred. A position where the sensor starts detection of the wafer is regarded as a wafer lowermost surface, and a position where the sensor ends detection of the wafer is regarded as a wafer uppermost surface. The distance of movement of the cassette base from the detection start position to the detection end position is detected as a thickness of the wafer. If (the original thickness of the wafer)=(the detected thickness of the wafer), it is determined that the wafer is stored correctly and the transfer process is started. If (the original thickness of the wafer)< (the detected thickness of the wafer), it is determined that the wafer is not stored correctly and the transfer process is stopped.

Figure 10A:
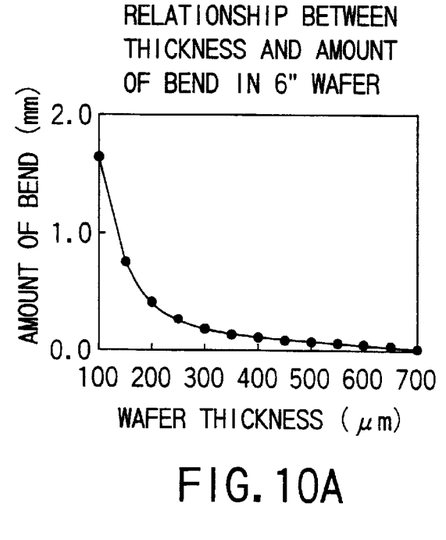
FIGS. 10A and 10B are diagrams for explaining the relationship between a thickness of a wafer and an amount of bend.
Figure 10B:
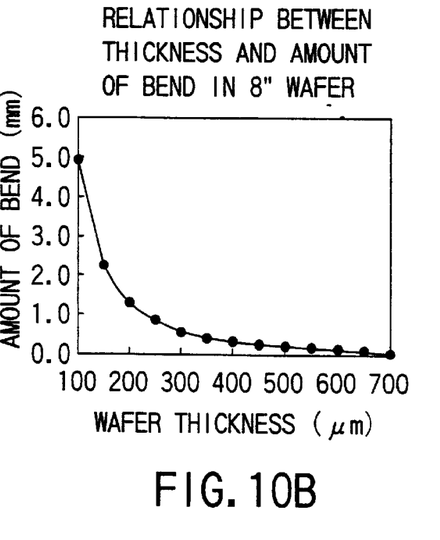

By the way, recently, as the wafer becomes larger and thinner, a problem of bend of a wafer stored in the wafer cassette is posed. For example, an amount of bend is defined as the difference in level between the circumferential edge portion held by the slot groove and the most bent portion, i.e., the central portion. FIGS. 10A and 10B show the relationship between the thickness and the amount of bend in the cases of 6-inch and 8-inch wafers.

According to FIG. 10B, for example, as regards 8-inch wafers, when the amount of bend of a wafer of the conventional standard thickness, 0.6 mm, is compared to the amount of bend of a wafer of the recent standard thickness, 0.1 mm, the amount of bend is increased by about 5 mm with the decrease in the amount of bend of the wafer.

The bend due to the decrease in thickness poses the following new problems.

First, in the conventional means for detecting an inclination of a wafer as a thickness by a sensor, a bend of the wafer is not taken into account. Therefore, according to the conventional art, the amount of bend is determined as a thickness, and even if the wafer is correctly inserted in left and right slot grooves on the same stage, it is erroneously determined that the wafer is not correctly stored and the transfer process is ended. Thus, a wafer having a bend cannot be transferred.

Secondly, when the wafer to be transferred is attracted on and lifted up by the transfer arm in the wafer cassette, if the bend of the wafer is not taken into account, the upper surface of the wafer to be transferred will be brought into contact with the lower surface of the bent wafer located above, resulting in a damage or crack of the wafer surface.

Thirdly, when an inspection or the like is completed and the wafer is restored in the wafer cassette by the transfer arm, if the bend of the wafer is not taken into account, a peripheral portion of the wafer may collide with the slot due to the bend in the peripheral portion, resulting in a crack of the wafer.

DISCLOSURE OF INVENTION

The present invention was made in consideration of the above situations. An object of the present invention is to provide a wafer transfer apparatus in which a bend of a wafer is taken into account, so that a crack of the wafer is surely prevented when the wafer is transferred.

The present invention provides a wafer transfer apparatus for taking out a wafer from a wafer cassette having grooves on both ends for holding circumferential edge portions of a plurality of wafers by moving a wafer taking out arm in height directions and back and forth directions relative to the wafer cassette, the wafer transfer apparatus comprising: bend detecting means for detecting bend of a wafer; and transfer means for inserting the wafer taking out arm into the wafer cassette, based on the bend, placing the wafer on the arm, and taking out the wafer from the cassette.

It is preferable that the transfer means comprise inserting means for determining, based on the bend, a position in which the wafer taking out arm is inserted into the wafer cassette, and inserting the arm in the determined position, and that the transfer means further comprise extracting means for determining, based on the bend, an amount of movement of the arm in a height direction of the cassette required to lift circumferential edge portions of the wafer from grooves, moving the arm inserted in the cassette in the height direction of the wafer cassette by the determined amount of movement, and extracting the arm from the cassette.

Further, it is preferable that the extracting means determine whether extraction is possible without contacting with another wafer, and that the inserting means determine whether the wafer taking out arm can be inserted in the wafer cassette without contacting with another wafer.

With the wafer transfer apparatus described above, positional information of a wafer in the wafer cassette is detected, and bend of the wafer is calculated. Based on the calculation result, it is possible to determine whether there is a clearance between wafers in which the transfer arm can be inserted. Further, when a wafer to be transferred is to be lifted up by the transfer arm, it is possible to determine whether there is an enough clearance to avoid contact with a wafer immediately above. As a result, contact between the wafer and the transfer arm and between wafers can be prevented, so that a transfer process can be executed without damaging or breaking a bent wafer.

Wafer bend detection by the bend detecting means and wafer transfer by the transfer means may be performed for the wafers one by one. In this case also, the same effect can be obtained.

On the other hand, it is possible that bend detection is performed by the bend detecting means for all wafers, and thereafter only transferable wafers are transferred by the transfer means. In this case also, the same effect can be obtained.

It is preferable that the bend detecting means detect bend by detecting a position of a central portion of the wafer.

Further, the bend detecting means may detect bend by detecting one or both of positions of circumferential edge portions of the wafer held by a groove of the wafer cassette, in addition to the position of the central portion of the wafer.

With the wafer transfer apparatus described above, when positions of the central portion and one of the circumferential edge portions of each wafer are detected, the bend, which varies from wafer to wafer, can be obtained accurately by calculating to what extent the considerably bent central portion is bent from the held circumferential edge portion.

The bend detecting means may detect bend based on the detected position of the central portion of the wafer and a position of a circumferential edge portion of the wafer determined by a pitch width of the wafer cassette. In this case also, the same effect can be obtained.

Further, the bend detecting means may detect bend by detecting positions of at least two different portions of the wafer. In this case also, the same effect can be obtained.

Further, when positions of the central portion and both circumferential edge portions are detected, even if the wafer is not inserted in slot grooves at the same height of the wafer cassette and held in an inclined state, the inclined state can be detected, since the positional information on the circumferential edge portions on both sides of the central portion of the wafer is detected. Therefore, it is possible to determined that the transfer arm may not be inserted in the wafer cassette.

There is also provided a wafer transfer apparatus including a base on which a wafer cassette storable a plurality of wafers is mounted, and a transfer arm, the transfer arm and the wafer cassette being movable relative to each other, the wafer transfer apparatus comprising: position detecting means for detecting position in vertical direction of each of the wafers in the wafer cassette; a calculating unit for calculating an amount of bend of each of the wafers based on positional information obtained by the detecting and measuring means; and a determining unit for determining, based on a calculation result of the calculating unit, whether the transfer arm can be inserted under a wafer to be transferred without contacting with another wafer and whether the wafer to be transferred can be lifted by the transfer arm without contacting to another wafer.

With the wafer transfer apparatus described above, positional information of a wafer in the wafer cassette is detected, and an amount of bend of the wafer is calculated. Based on the calculation result, it is possible to determine whether there is a clearance between the wafers in which the transfer arm can be inserted. Further, when a wafer to be transferred is to be lifted up by the transfer arm, it is possible to determine whether there is an enough clearance to avoid contact with a wafer immediately above. As a result, contact between the wafer and the transfer arm and between wafers can be prevented, so that a transfer process can be executed without damaging or breaking a bent wafer.

It is preferable that the position detecting means comprise a sensor for detecting a position of a central portion of each of the wafers. It is also preferable that the position detecting means comprise a sensor for detecting a position of a central portion of each of the wafers, and a sensor for detecting a circumferential edge portion of each of the wafers held by the wafer cassette.

With the wafer transfer apparatus described above, two positions of the central portion and a circumferential edge portion of each wafer are detected. The bend, which varies from wafer to wafer, can be obtained accurately by calculating to what extent the considerably bent central portion is bent from the held circumferential edge portion.

The position detecting means may comprise a sensor for detecting a position of a central portion of each of the wafers, and sensors for detecting circumferential edge portions of each of the wafers held by the wafer cassette on both sides of the sensor.

With the wafer transfer apparatus described above, even if the wafer is not inserted in slot grooves at the same height of the wafer cassette and held in an inclined state, the inclined state can be detected, since the positional information on the circumferential edge portions on both sides of the central portion of the wafer is detected. Therefore, it is possible to determined that the transfer arm may not be inserted in the wafer cassette.

BEST MODE OF CARRYING OUT THE INVENTION (First Embodiment)

Figure 1:
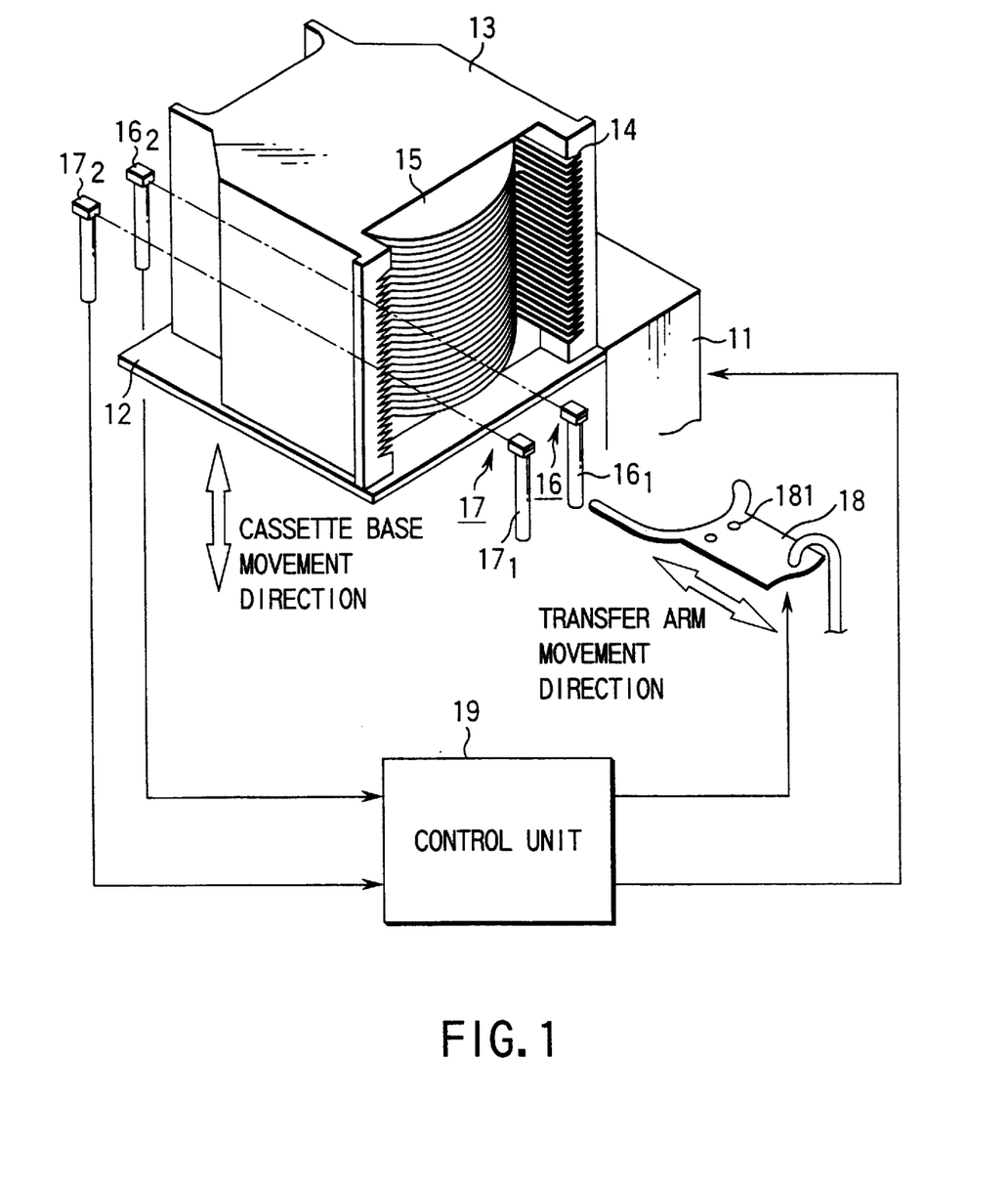
FIG. 1 is a schematic diagram showing a first embodiment of the present invention.

FIG. 1 shows a general structure of a wafer transfer apparatus according to a first embodiment. A wafer cassette 13 storing a number of wafers 15 one on another is mounted on a cassette base 12 is movable up and down by an elevator mechanism portion 11, such that a wafer 15-inlet/outlet side faces a transfer arm 18 having an attracting portion 181.

A first light transmission-type sensor 16, having light emitting portions $16_1$ and $16_2$, detects positional information of a central portion of the wafer 15. Similarly, a second light transmission-type sensor 17, having light emitting portions $17_1$ and $17_2$, detects positional information of a circumferential edge portion of the wafer 15.

In this embodiment, the light transmission-type sensors 16 and 17 are fixed while the cassette base 12 is moved up and down by the elevator mechanism portion 11, thereby detecting positional information of each of the wafers 15 in the wafer cassette.

In contrast to this embodiment, it is possible that the cassette base 12 is fixed and the light transmission-type sensors 16 and 17 and the transfer arm 18 are moved up and down, thereby detecting positional information of each of the wafers 15, to perform a transfer process.

A control unit 19 detects and stores positional information of the central portion obtained by the light transmission-type sensor 16 and positional information of the circumferential edge portion obtained by the light transmission-type sensor 17. Further, it calculates an amount of bend of the wafer 15 from the two pieces of positional information.

As will be described later in detail, the control unit 19 determines, from the calculated amount of bend, whether the transfer arm 18 can be inserted under a wafer to be transferred and whether, after the insertion, the transfer arm 18 can lift up the wafer 15 to take it out.

Then, an operation of the apparatus will be described with reference to FIGS. 2 to 4.

Figure 2:
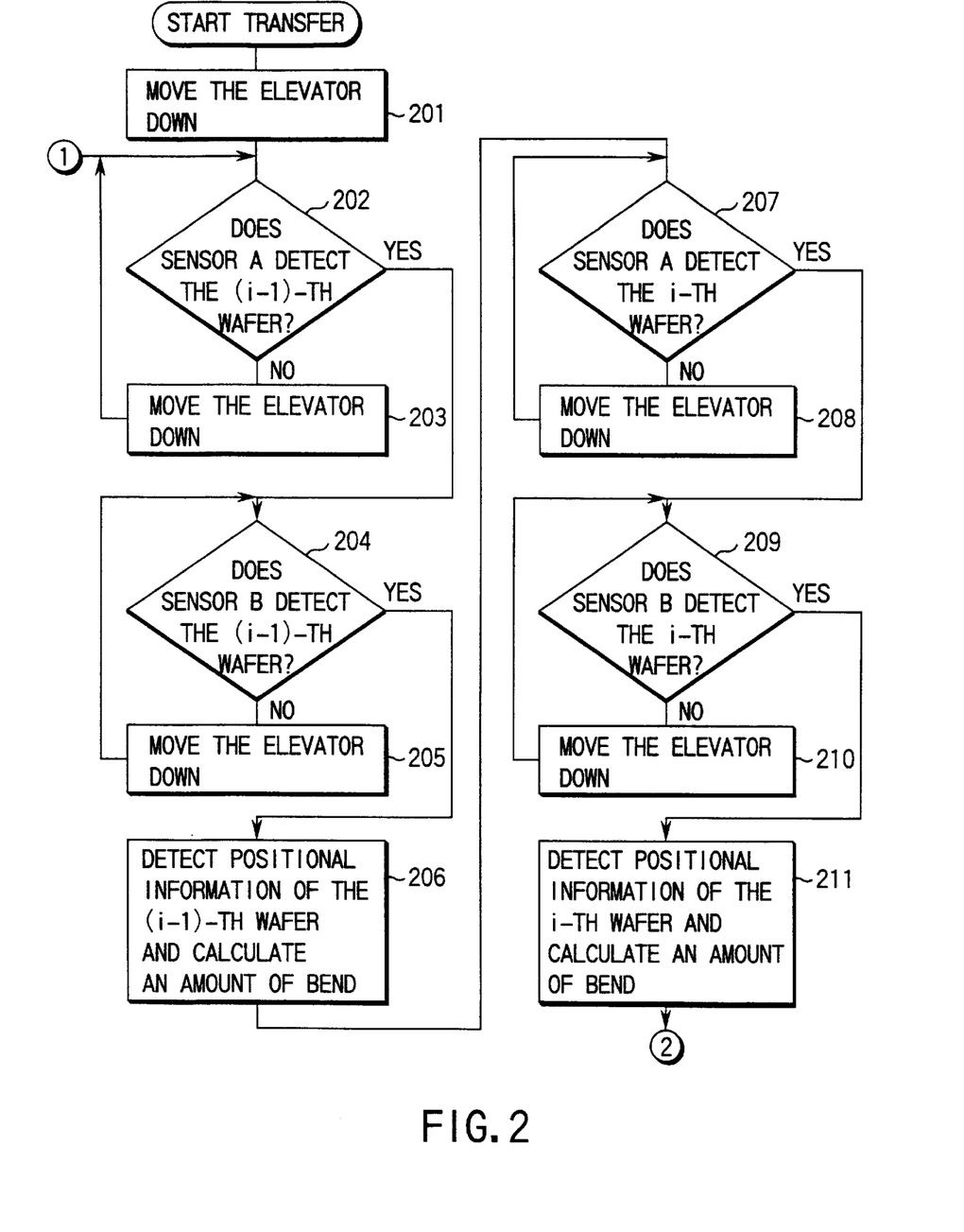
FIG. 2 is a flowchart for explaining an operation of the first embodiment.
Figure 3:
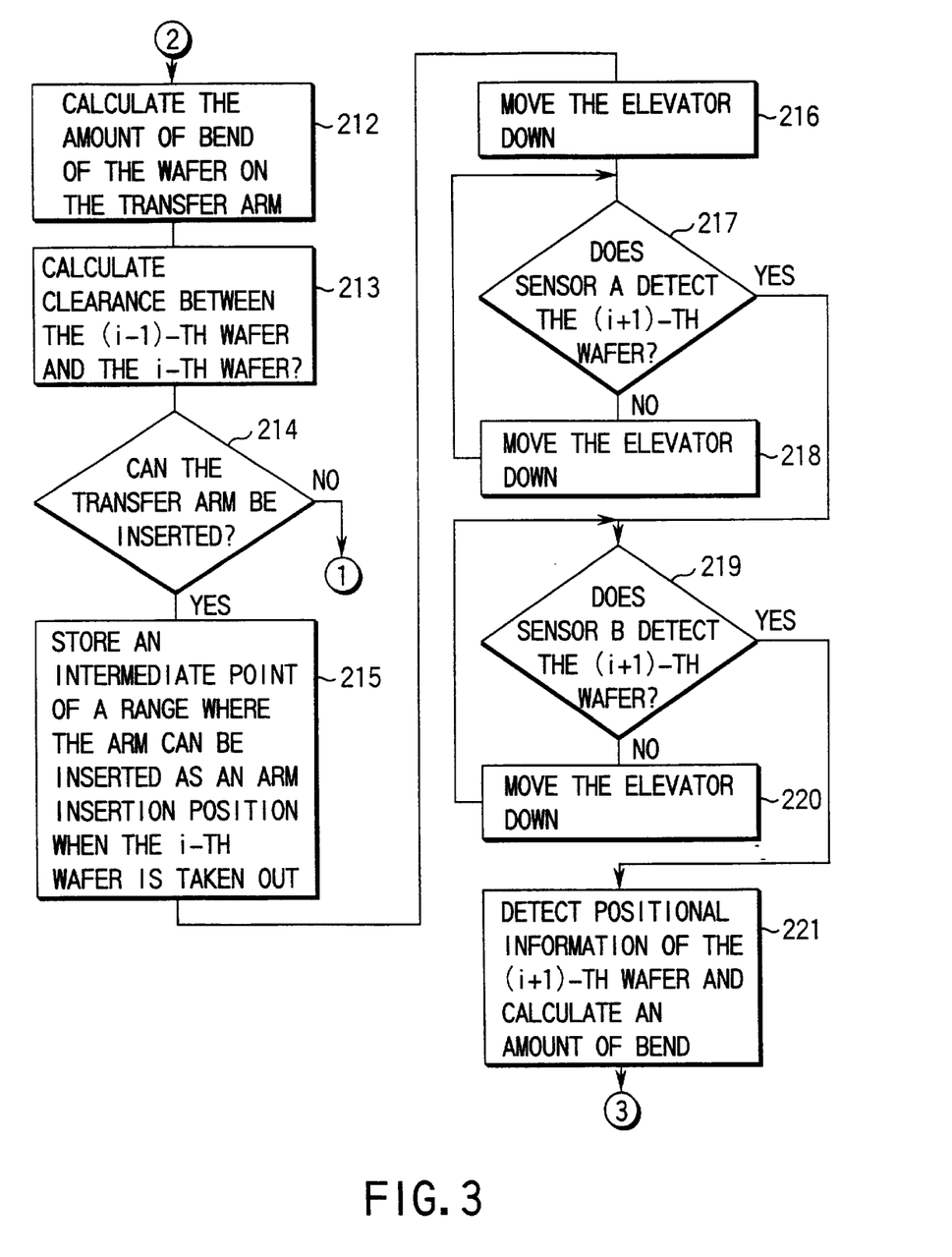
FIG. 3 is a flowchart for explaining an operation of the first embodiment.
Figure 4:
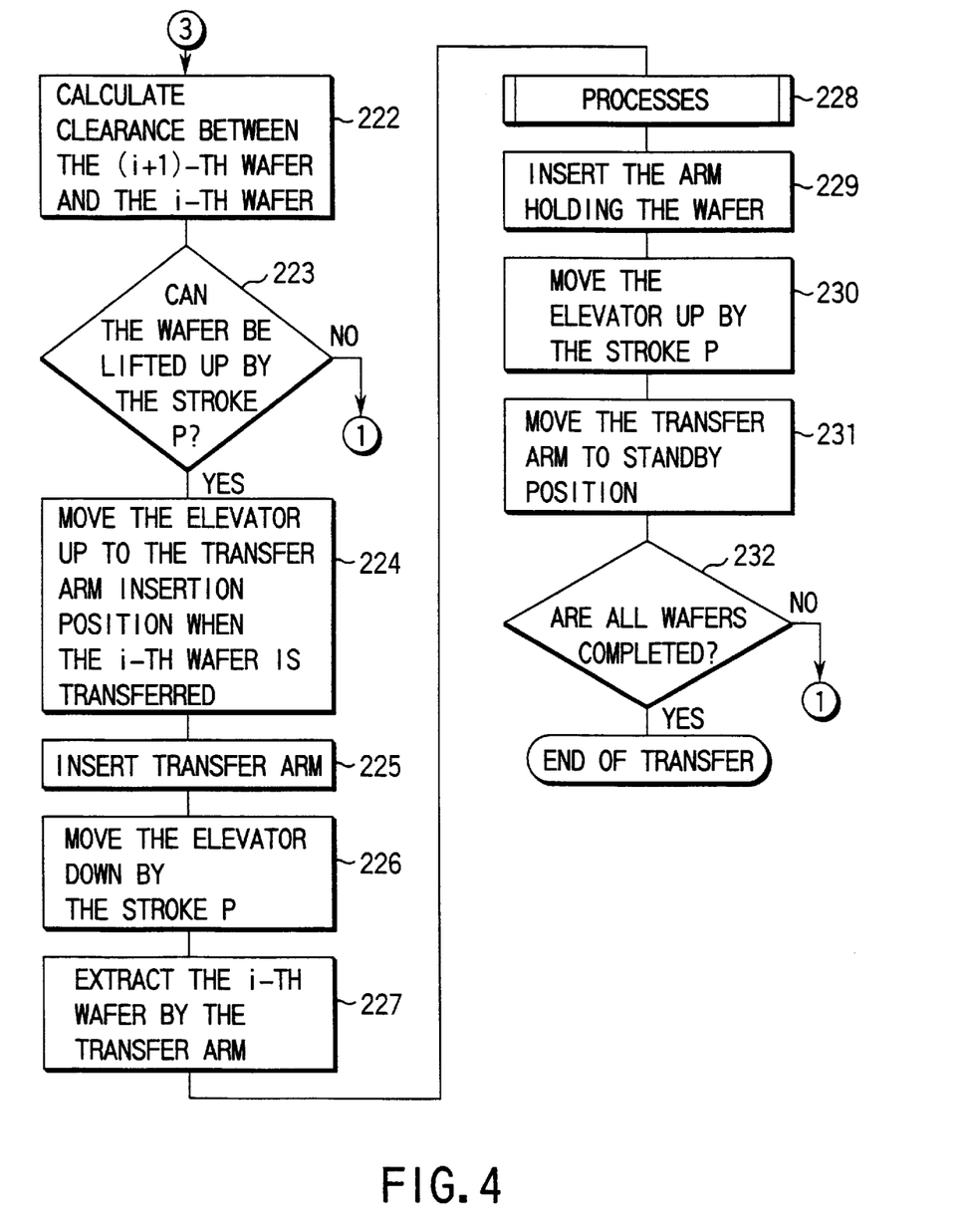
FIG. 4 is a flowchart for explaining an operation of the first embodiment.

FIGS. 2, 3 and 4 are flowcharts depicting an operation in the apparatus for transferring a wafer 15 i-th from the lowermost stage in the wafer cassette 13 (hereinafter referred to as an i-th wafer 15). The wafer cassette 13 is mounted on the cassette base 12 movable up and down by the elevator mechanism portion 11. When a switch (not shown) is turned on to instruct a start of transfer of the wafer 15, the apparatus operates in accordance with the procedures of the flowcharts.

In the following, it is assumed that i=n, and a transfer operation of an n-th wafer 15 will be described.

First, the cassette base 12 is moved down by the elevator mechanism portion 11 (step S201).

Then, it is determined whether the first sensor 16 detects a central portion of an (n−1)-th wafer 15 in the wafer cassette 13 (step S202).

FIGS. 5A, 5B, 5C, 5D, 5E and 5F are front views of the elevator mechanism portion 11, the cassette base 12 and the wafer cassette 13 of FIG. 1, seen from the wafer 15 inlet/outlet side, on the assumption that the (n−1)-th wafer 15 is the lowermost wafer 15 (i.e., n=2).

Figures 5A, 5B:
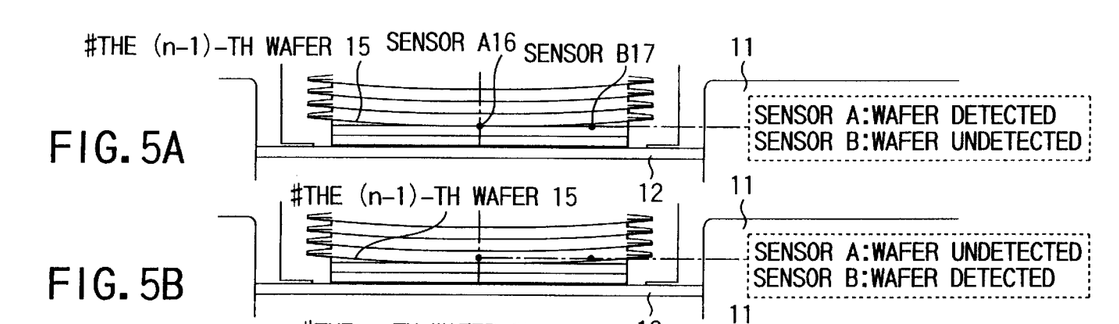
FIGS. 5A, 5B, 5C, 5D, 5E and 5F are diagrams for explaining the first embodiment.

FIG. 5A shows a case in which the central portion of the (n−1)-th wafer 15 is detected by the first sensor 16 in the step S202.

If the central portion of the (n−1)-th wafer 15 is not detected by the first sensor 16, the cassette base 12 is further moved down by the elevator mechanism portion 11 (step S203). The same operation is repeated until the central portion of the (n−1)-th wafer 15 is detected.

Subsequently, it is determined whether the circumferential edge portion of the (n−1)-th wafer 15 is detected by the second sensor 17 (step S204). If it is not detected, the cassette base 12 is further moved down by the elevator mechanism portion 11 (step S205). The same operation is repeated until the circumferential edge portion of the (n−1)-th wafer 15 is detected.

FIG. 5B shows a case in which the circumferential edge portion of the (n−1)-th wafer 15 is detected by the second sensor 17 in the step S204.

When the circumferential edge portion of the (n−1)-th wafer 15 is detected by the second sensor 17, the amount of bend of the (n−1)-th wafer 15 is calculated on the basis of the positional information on the central portion and the circumferential portion of the (n−1)-th wafer 15 detected by the first sensor 16 and the second sensor 17 (step S206). At this time, if the detected positions of the central portion and the circumferential edge portion of the (n−1)-th wafer 15, detected by the first sensor 16 and the second sensor 17, are completely the same, it is determined that the wafer 15 does not have a bend and is held horizontally.

Figures 5C, 5D, 5E, 5F:
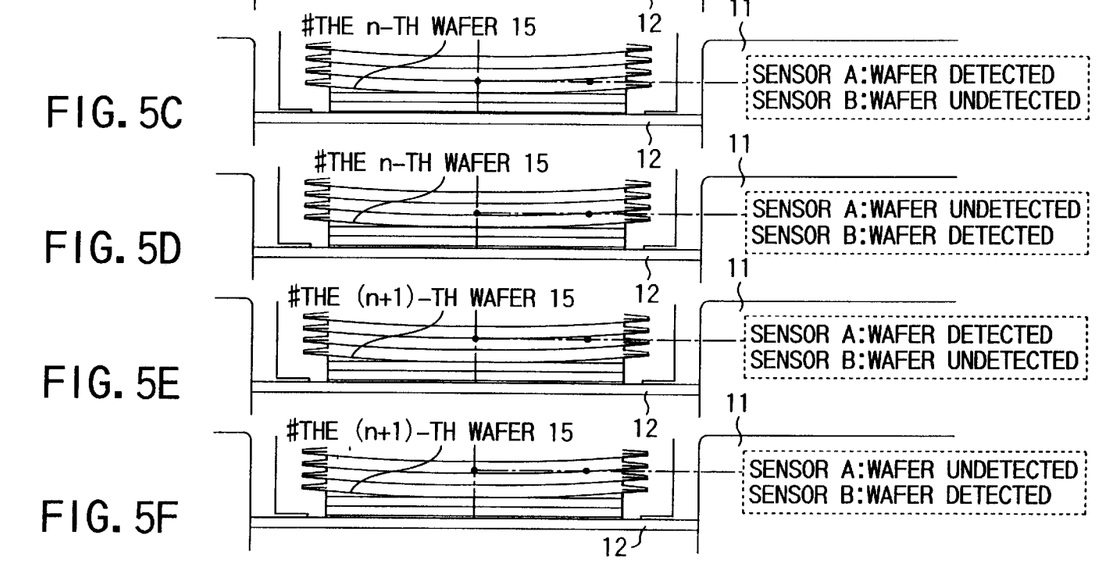

Next, as shown in FIGS. 5C and 5D, positional information on a central portion and a circumferential edge portion of an n-th wafer are detected by the first sensor 16 and the second sensor 17. An amount of bend is calculated in the same manner as in the case of the (n−1)-th wafer 15 (steps S207–S211).

Then, based on the amount of bend calculated in the step S211, an amount of bend of the n-th wafer 15, in a case where it is attracted and held on the transfer arm 18, is calculated. Further, based on this amount of bend, an amount of a rise of the transfer arm 15 (stroke P), sufficient for a peripheral portion of the n-th wafer 15 to be removed from the slot groove 14, is determined (step S212).

Figure 6A:
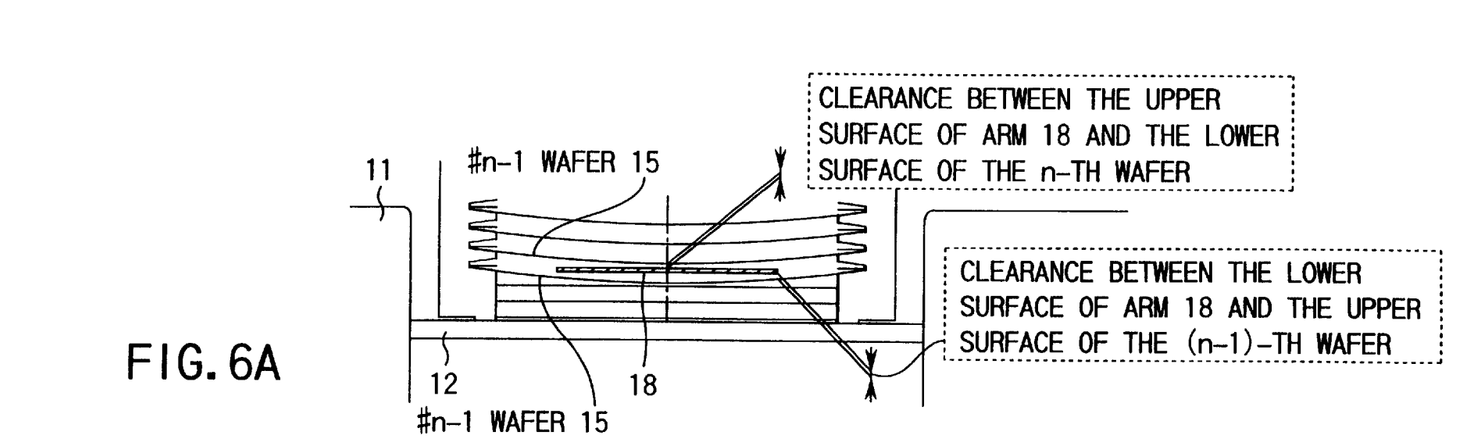
FIGS. 6A and 6B are diagrams for explaining the first embodiment.

Subsequently, a clearance between the (n−1)-th wafer 15 and the n-th wafer 15 is calculated from the positional information and the amounts of bend of the (n−1)-th wafer 15 and the n-th wafer 15 (step S213), and it is determined whether the transfer arm can be inserted (step S214). In other words, in the step S214, as shown in FIG. 6A, it is determined on the basis of the calculation in the step S213 whether an enough clearance to avoid contact between the upper surface of the transfer arm 18 and the lower surface of the n-th wafer 15 and between the lower surface of the transfer arm 18 and the upper surface of the (n−1)-th wafer 15 is secured, when the transfer arm 18 is inserted between the (n−1)-th wafer 15 and the n-th wafer 15.

If it is impossible to insert the transfer arm 18 in the step S214, transfer of the n-th wafer 15 is determined to be impossible. Subsequently i is incremented by +1, and the operation proceeds to transfer of an (n+1)-th wafer 15.

On the other hand, if it is possible to insert the transfer arm 18 in the step S214, an intermediate point of a range where the transfer arm 18 can be inserted is stored in memory means as an insertion position of the transfer arm 18 when the n-th wafer 15 is taken out (step S215).

Then, as shown in FIGS. 5E and 5F, positional information of a central portion and a circumferential edge portion of the (n+1)-th wafer are detected by the first sensor 16 and the second sensor 17. An amount of bend is calculated in the same manner as in the cases of the (n−1)-th and the n-th wafers 15 (steps S216–S221).

Figure 6B:
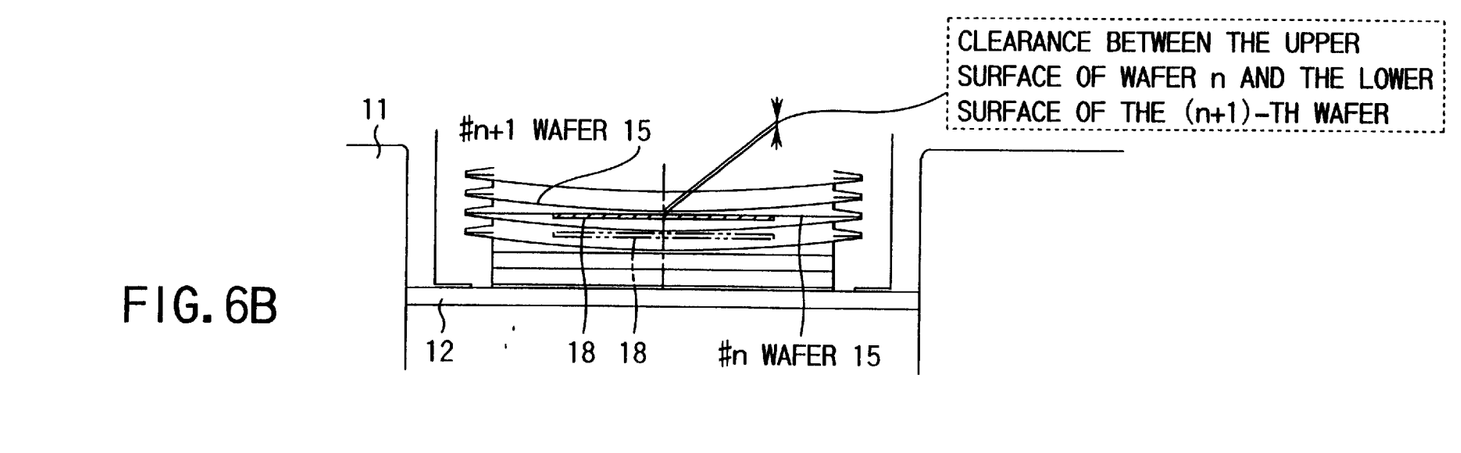

Subsequently, a clearance between the (n+1)-th wafer 15 and the n-th wafer 15 is calculated from the positional information and the amount of bend of the steps S211 and S221 (step S222). It is determined on the basis of the clearance between the (n+1)-th wafer 15 and the n-th wafer 15 and the stroke P determined in the step S212 whether the n-th wafer can be lifted up without contact between the wafers 15. In other words, it is determined whether an enough clearance to avoid bringing the upper surface of the n-th wafer 15 into contact with the lower surface of the (n+1)-th wafer 15 is secured, when the n-th wafer 15 is lifted up by the stroke P sufficient to remove the circumferential edge portions from the slot grooves 14, as shown in FIG. 6B (step S223).

If it is impossible to lift the n-th wafer 15 by the transfer arm 18 in the step S223, transfer of the n-th wafer 15 is determined to be impossible, i is incremented by +1, the operation returns to the step S202, and proceeds to transfer of an (n+1)-th wafer 15.

On the other hand, if it is possible to lift the n-th wafer 15 by the transfer arm 18 in the step S223, the cassette base 12 is moved by the elevator mechanism portion 11 so that the transfer arm 18 can be placed at the insertion position stored in the step S215 (step S224).

In the step S224, the cassette base 12 is moved by the elevator mechanism portion 11 so that the transfer arm 18 can be placed at the insertion position stored in the step S215 (step S214). Thereafter, the transfer arm 18 is inserted to the insertion position under the n-th wafer 15 (step S225). Then, after the attracting the n-th wafer 15 by the attracting portion 181, the cassette base 12 is moved down by the stroke P determined in the step S212 (step S226), the n-th wafer 15 is set to a state so as not be in contact with the slot groove 14 and the (n+1)-th wafer 15 (the position of the elevator mechanism portion 11 at this time is called an extracting position). The n-th wafer 15 is extracted from the wafer cassette 13 (step S227), and other processes, such as an inspection, are executed (step S228).

After the other processes are completed, the elevator mechanism portion 11 is placed at the extracting position in the step S227, the transfer arm 18 attracting and holding the n-th wafer 15 is inserted into the wafer cassette 13, and the attraction by the attracting portion 181 is released (step S229).

Then, the cassette base 12 is moved up by the stroke P and the circumferential edge portions of the n-th wafer 15 is held by the slot grooves 14, thereby storing it in the wafer cassette 13 (step S230). The transfer arm 18 is moved to a standby position (step S231). Thus, the operation of transferring the n-th wafer 15 is completed.

Subsequently, the same procedures as described above are repeated with respect to all wafers 15 stored in the wafer cassette 13 (step s232), and the transfer process is ended.

When the wafer 15 at the lowermost stage of the wafer cassette 13 is transferred, the position of the upper surface of a connecting member, which is provided under the lowermost wafer 15 on the cassette bottom surface to connect both side walls of the wafer cassette 13, is detected. Thus, the clearance between the upper surface of the connecting member and the lower surface of the lowermost wafer 15 can be calculated, and it can be determined whether the transfer arm 18 can be inserted or not.

With the structure described above, the following advantages can be obtained.

First, the positional information on the wafer 15 in the wafer cassette 13 is detected to calculate the bend of the wafer 15, and based on the calculation result, it is determined whether there is a clearance under the wafer 15 in which the transfer arm 18 can be inserted. Therefore, an interference between the wafer 15 and the transfer arm 18 and a damage due to the interference can be prevented.

Secondly, the positional information on the wafer 15 in the wafer cassette 13 is detected to calculate the bend of the wafer 15, and based on the calculation result, it is determined whether there is an enough clearance to avoid contact between the wafer 15 and another wafer at the immediately above stage, when the wafer 15 is lifted up by the transfer arm 18. Therefore, contact between the wafers 15 can be avoided and a crack or damage of the wafers 15 can be prevented.

Thirdly, positional information of each wafer 15 is detected to calculate an amount of bend of the wafer 15. Based on the calculation result, an amount of bend of a circumferential edge portion of the wafer 15 when the wafer is attracted and held by the transfer arm 18 is calculated and compared with the stroke P. Therefore, when the wafer 15 is extracted or inserted, it is possible to prevent an interference between the slot groove 14 of the wafer cassette 13 and the circumferential edge portion of the wafer 15, and a damage or generation of dust due to the interference.

Fourthly, the position of the upper surface of the connecting member, provided under the lowermost wafer 15 to connect both side walls of the wafer cassette 13, is detected, so that the clearance between the aforementioned upper surface and the lower surface of the lowermost wafer 15 can be calculated to determine whether the transfer arm 18 can be inserted. Therefore, it is possible to avoid an interference between the connecting member and the transfer arm 18, thereby preventing a damage of the transfer arm 18.

Fifthly, positional information on each wafer 15 is detected and an amount bend of the wafer 15 is calculated. Based on the calculation result, the possibility of the transfer arm 18 being inserted and the possibility of the wafer 15 being lifted are determined. Therefore, even if the different thickness wafers 15 are stored in the same wafer cassette 13 are transferred the wafers 15, the transfer process can be performed without damaging the wafers 15 or the transfer arm 18.

The present invention is not limited to the first embodiment described above, but can be modified variously as described in the following sections (1) and (2) without changing the gist of the invention.

(1) In the first embodiment, each time a wafer 15 is transferred, a position is detected, an amount of bend is calculated, a clearance between wafers 15 is calculated, it is determined whether insertion between the wafers 15 is possible or not, and it is determined whether lift of the wafer 15 is possible or not. However, in order to improve the throughput of the apparatus, it is possible to first detect a position, calculate an amount of bend, calculate clearances between wafers 15, and determine whether the insertion and the lift are possible, with respect all the wafers in the wafer cassette 13, store the information in memory means, and transfer only transferable wafers 15.

(2) In the first embodiment, the sensor 16 for detecting a central portion of a wafer 15 in the wafer cassette 13, where an amount of bend is great, and the second sensor 17 for detecting a circumferential edge portion which is inserted in the slot groove 17 are provided, so that positional information can be detected. However, since the size of the wafer cassette 13 and the pitch width of the cassette are fixed, it is possible to omit detection of the circumferential edge portion of the wafer 15 and detect by means of the sensor 16 only the central portion of the wafer 15, in which an amount of bend is great. In other words, since the position of the circumferential edge portion of a wafer 15 can be determined by the size of the wafer cassette 13 and the pitch width of the cassette, if these values are prestored in memory means, they can be used in place of positional information on the circumferential edge portion of the wafer 15 detected by the sensor 17.

(Second Embodiment)

In the first embodiment, the first sensor 16 and the second sensor 17 detect two positions: a central portion and a peripheral portion of the wafer 15 stored in the wafer cassette 13. An amount of bend is calculated on the basis of the positional information.

However, the aforementioned two positions are not necessarily detected, but other two positions may be detected, and an amount of bend of the wafer 15 may be estimated on the basis of the positional information and the size of the wafer. That is, the position of the wafer 15 may be detected by sensors provided at two different positions at same heights, and an internal calculation may be executed on the basis of the difference in height between the two different positions at which the wafer 15 is detected, thereby calculating an amount of bend of the wafer 15. In this case, the same effect as that of the first embodiment can be obtained.

(Third Embodiment)

In the first embodiment, the first sensor 16 and the second sensor 17 detect two positions: a central portion and a peripheral portion of the wafer 15 stored in the wafer cassette 13. An amount of bend is calculated on the basis of the positional information.

However, the detection of the only two positions may not detect a case in which the wafer 15 is inserted in slot grooves at different heights on the left and right. In this case, when the transfer arm 18 is inserted, the transfer arm 18 may collide with the wafer 15 and the wafer 15 may be damaged.

Figure 7A:
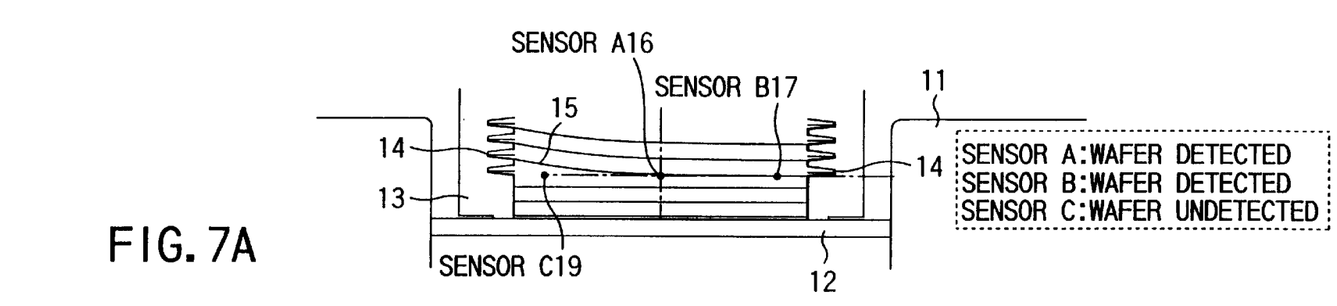
FIGS. 7A and 7B are diagrams for explaining a third embodiment.
Figure 7B:
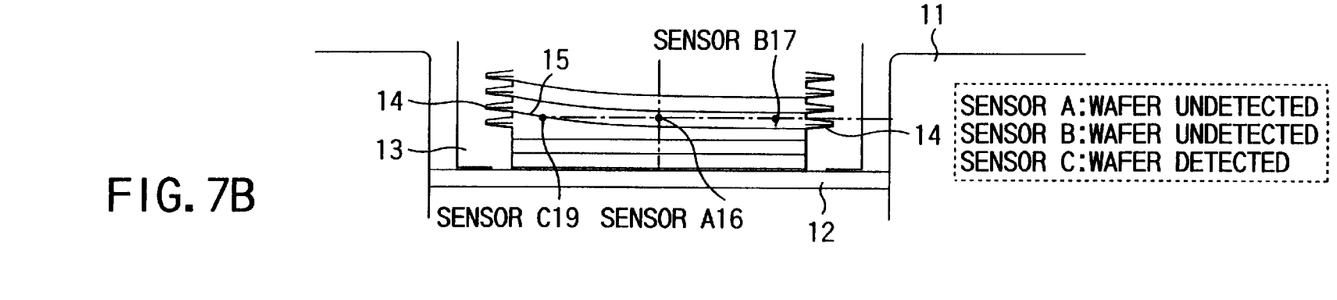

Therefore, in addition to the first sensor 16 and the second sensor 17 of the first embodiment, the third embodiment has a third sensor 19 for detecting another circumferential edge portion which is not detected by the second sensor 17 (a circumferential edge portion on the left side in the front view). The third sensor 19 is provided at the same height as the first sensor 16 and the second sensor 17.

FIGS. 7A and 7B is a front view of the elevator mechanism portion 11, the cassette base 12 and the wafer cassette 13, seen from the wafer 15 inlet/outlet side. The front view shows a state where a wafer 15 is inserted in left and right slot grooves 14 on the different stages.

Described below is a procedure in the third embodiment for determining whether a wafer 15 is inserted in left and right slot grooves 14 at different heights (more specifically, the circumferential edge portion on the left side in the front view is inserted in one stage higher slot groove).

Referring to FIG. 7A, first, the first sensor 16 and the second sensor 17 detect a central portion and a right side circumferential edge portion of the lowermost wafer 15. In the front view, the wafer is stored in the cassette with the left side circumferential edge portion being higher than the right side circumferential edge portion. Therefore, at this time, the third sensor 19 does not detect the left side circumferential edge portion of the lowermost wafer 15.

Next, referring to FIG. 7B, the cassette base 12 is further moved down by the elevator mechanism portion 11, so that the third sensor 19 can detect the left side circumferential edge portion of the wafer 15. At this time, the first sensor 16 and the second sensor 17 do not detect the lowermost wafer 15.

At this time, if there is a difference in height, substantially equal to the length of a slot groove 14, between the left and right circumferential edge portions detected by the second sensor 17 and the third sensor 19, it is determined that the wafer 15 is not correctly stored in the slot grooves 14.

Then, insertion of the transfer arm 18 into the wafer cassette 13 is stopped, or a warning, alarm or the like is given to inform that the wafer 15 is not correctly stored.

With the structure described above, it is possible to determine whether the wafer 15 is stored in left and right slot grooves at the same height based on the positional information on the left and right side circumferential edge portions of the wafer 15 obtained by the second sensor 17 and the third sensor 19, in addition to the amount of bend of the wafer 15 calculated on the basis of the positional information detected by the first sensor 16 and the second sensor 17.

As a result, it is possible to prevent a damage or the like of the wafer 15 due to an interference between the wafer 15 and the transfer arm 18.

(Fourth Embodiment)

In the fourth embodiment, as shown in FIG. 8, three distance measuring sensors 20, 21 and 22 are provided under the cassette base 12 to detect a central portion and circumferential edge portions on both sides of the central portion of the wafer 15 stored in the lowermost stage of the wafer cassette 13. The sensors 20, 21 and 22 emit light and measure a distance based on a time required for the light to return. For measuring the distance, there is a space under the cassette base 12 and the wafer cassette 13 so that light emitted from the sensors 20, 21 and 22 can be radiated on a wafer.

In the fourth embodiment, first, the distance measuring sensors 20, 21 and 22 detect distances from the sensors to a central portion and circumferential edge portions on both sides of the central portion of the lowermost wafer 15. Based on the three detected distances, an amount of bend of the wafer is calculated.

Next, an insertion position of the transfer arm 18 and a stroke P of the cassette base 12 are obtained on the basis of the amount of bend of the wafer cassette 15 and the prestored slot pitch of the wafer cassette 13.

With the structure described above, as in the first embodiment, even if the wafer 15 is thin and therefore bent, a damage of the wafer 15 due to an interference between the wafer 15 and the transfer arm 18 and a damage of the transfer arm 18 due to an interference between the transfer arm 18 and the connecting member which connect the side walls of the wafer cassette 13 are prevented, while the wafer transfer process is executed.

Further, information on the insertion positions of the transfer arm 18 about the respective wafers 15 can be obtained only by detecting information on bend of the one wafer stored in the lowermost position of the wafer cassette 13 without up and down-moving of the cassette base 12. Therefore, the wafer transfer process time can be reduced.

(Fifth Embodiment)

In the first embodiment, a calculation is executed on the basis of detected positional information to obtain an amount of bend of a wafer 15. However, it is possible that the thickness of a wafer 15 is measured and an amount of bend of the wafer 15 is detected on the basis of the thickness. More specifically, it is possible that a sensor for detecting a thickness of a wafer 15 is provided, and a correlation table showing the relationship between an amount of bend and a thickness of the wafer 15 is prestored in memory means, so that an amount of bend of the wafer 15 can be obtained by collating the thickness measured by the sensor with the table.

With the structure described above, the same effect as that of the first embodiment is obtained. In addition, since the sensor is provided only at a position to measure the thickness of a wafer 15, the apparatus can be simplified.

Further, if the amount of bend due to a difference in height between the central portion and the circumferential edge portion of the wafer 15 held by the slot grooves 14 is distinguished from the amount of bend due to a sag of the circumferential edge portion of the wafer 15 attracted and held by the transfer arm 18, correlation tables respectively showing the relationships between a thickness of the wafer 15 and each of the amounts of bend are prestored in the memory means, and the same collation as described above is performed, a damage of the wafer and generation of dust can be prevented more reliably.

INDUSTRIAL APPLICABILITY

In the first to fifth embodiments described above, it is possible to determine, by taking an amount of bend of a wafer into account, whether the transfer arm can be inserted and whether the transfer arm can be moved up to take out the wafer after the transfer arm is inserted. If it is determined that both are possible, the insertion position of the transfer arm can be determined accurately. In addition, after the transfer arm is inserted, the amount of moving up the transfer arm (stroke) required for taking out the wafer can be determined accurately. Therefore, a wafer transfer apparatus for reliably preventing a damage of a wafer in a wafer transfer operation can be realized.

What is claimed is:

1. A wafer transfer apparatus for taking out a wafer from a wafer cassette having grooves on both ends for holding circumferential edge portions of a plurality of wafers by moving a wafer taking out arm in height directions and back and forth directions relative to the wafer cassette, the wafer transfer apparatus comprising:

bend detecting means for detecting bend of a wafer; and transfer means for inserting the wafer taking out arm into the wafer cassette, based on the bend, placing the wafer on the arm, and taking out the wafer from the cassette.

2. The wafer transfer apparatus according to claim 1, wherein the transfer means comprises inserting means for determining, based on the bend, a position in which the wafer taking out arm is inserted into the wafer cassette, and inserting the arm in the determined position.

3. The wafer transfer apparatus according to claim 2, wherein the transfer means further comprises extracting means for determining, based on the bend, an amount of movement of the arm in a height direction of the cassette required to lift circumferential edge portions of the wafer from grooves, moving the arm inserted in the cassette in the height direction of the wafer cassette by the determined amount of movement, and extracting the arm from the cassette.

4. The wafer transfer apparatus according to claim 3, wherein the extracting means determines whether extraction is possible without contacting with another wafer.

5. The wafer transfer apparatus according to claim 2, wherein the inserting means determines whether the wafer taking out arm can be inserted in the wafer cassette without contacting with another wafer.

6. The wafer transfer apparatus according to claim 1, wherein the bend detecting means detects bend by detecting a position of a central portion of the wafer.

7. The wafer transfer apparatus according to claim 6, wherein the bend detecting means detects bend by detecting the position of the central portion of the wafer and at least one of positions of circumferential edge portions of the wafer held by grooves of the wafer cassette.

8. The wafer transfer apparatus according to claim 6, wherein the bend detecting means detects bend based on the detected position of the central portion of the wafer and a position of a circumferential edge portion of the wafer determined by a pitch width of the wafer cassette.

9. The wafer transfer apparatus according to claim 1, wherein the bend detecting means detects bend by detecting positions of at least two different portions of the wafer.

10. The wafer transfer apparatus according to claim 1, wherein wafer bend detection by the bend detecting means and wafer transfer by the transfer means are performed for the wafers one by one.

11. The wafer transfer apparatus according to claim 1, wherein, bend detection is performed by the bend detecting means for all wafers, and thereafter only transferable wafers are transferred by the transfer means.

12. A wafer transfer apparatus including a base on which a wafer cassette storing a plurality of wafers is mounted, and a transfer arm, the transfer arm and the wafer cassette being movable relative to each other, the wafer transfer apparatus comprising:

position detecting means for detecting position of each of the wafers in vertical direction in the wafer cassette;

a calculating unit for calculating an amount of bend of each of the wafers based on positional information obtained by the position detecting means; and a determining unit for determining, based on a calculation result of the calculating unit, whether the transfer arm can be inserted under a wafer to be transferred without contacting with another wafer and whether the wafer to be transferred can be lifted by the transfer arm without contacting with another wafer.

13. The wafer transfer apparatus according to claim 12, wherein the position detecting means comprises a sensor for detecting a position of a central portion of each of the wafers.

14. The wafer transfer apparatus according to claim 12, wherein the position detecting means comprises:

a sensor for detecting a position of a central portion of each of the wafers; and a sensor for detecting a circumferential edge portion of each of the wafers held by the wafer cassette.

15. The wafer transfer apparatus according to claim 12, wherein the position detecting means comprises:

a sensor for detecting a position of a central portion of each of the wafers; and sensors for detecting circumferential edge portions of each of the wafers held by the wafer cassette on both sides of the sensor.

* * * * *